(12) United States Patent
Oka

(10) Patent No.: US 7,165,979 B1
(45) Date of Patent: Jan. 23, 2007

(54) TERMINAL CONNECTION STRUCTURE, ELECTRICAL JUNCTION BOX HAVING THE TERMINAL CONNECTION STRUCTURE, AND METHOD FOR ASSEMBLING THE ELECTRICAL JUNCTION BOX

(75) Inventor: Tatsuya Oka, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 0 days.

(21) Appl. No.: 11/455,775

(22) Filed: Jun. 20, 2006

(30) Foreign Application Priority Data

Jul. 21, 2005 (JP) .............................. 2005-211446

(51) Int. Cl.
*H05K 1/00* (2006.01)
(52) U.S. Cl. ...................................... 439/76.2; 439/381
(58) Field of Classification Search ............... 439/76.2, 439/381, 752.5, 943, 949
See application file for complete search history.

(56) References Cited

U.S. PATENT DOCUMENTS

| | | | | |
|---|---|---|---|---|
| 4,781,621 A | * | 11/1988 | Sugiyama et al. | 439/559 |
| 4,992,054 A | * | 2/1991 | Cassan | 439/892 |
| 5,195,913 A | * | 3/1993 | Shattuck | 439/748 |
| 5,286,218 A | * | 2/1994 | Sakurai et al. | 439/444 |
| 5,539,619 A | | 7/1996 | Murakami | |
| 5,658,173 A | * | 8/1997 | Genta | 439/752.5 |
| 6,171,133 B1 | * | 1/2001 | Altuner et al. | 439/381 |
| 6,572,412 B1 | * | 6/2003 | Beuther et al. | 439/620.21 |
| 6,780,026 B1 | * | 8/2004 | Sato | 439/76.2 |
| 6,929,489 B1 | * | 8/2005 | Asao et al. | 439/140 |
| 2003/0157844 A1 | | 8/2003 | Kamiya | |
| 2003/0162434 A1 | * | 8/2003 | Kamiya | 439/140 |
| 2004/0180582 A1 | * | 9/2004 | Nakamura | 439/733.1 |
| 2005/0136708 A1 | * | 6/2005 | Shimoda et al. | 439/76.2 |
| 2006/0154499 A1 | * | 7/2006 | Naito et al. | 439/76.2 |

FOREIGN PATENT DOCUMENTS

| | | |
|---|---|---|
| JP | A 7-95716 | 4/1995 |
| JP | A 9-180831 | 7/1997 |
| JP | A 9-186475 | 7/1997 |
| JP | A 2003-243087 | 8/2003 |
| JP | A 2003-249288 | 9/2003 |

* cited by examiner

*Primary Examiner*—Gary F. Paumen
(74) *Attorney, Agent, or Firm*—Oliff & Berridge, PLC

(57) ABSTRACT

A terminal through-hole in which a given clearance exists between an inner surface of a terminal through-hole in an insulation plate and a whole peripheral surface of a terminal. The terminal through-hole includes protrusions for correction of alignment. The terminal includes bulged portions that engage the protrusions in the terminal through-hole when an end of the terminal is inserted into a terminal hole in a printed board. Before soldering the end of the terminal to a conductor on the printed board, the insulation plate is moved toward the other end of the terminal and the bulged portions of the terminal no longer engage the protrusions in the terminal through-hole. By thus releasing correction of alignment of the terminal after insertion, the possibility of cracks in the soldered part is reduced.

12 Claims, 5 Drawing Sheets

TERMINAL CONNECTION STRUCTURE, ELECTRICAL JUNCTION BOX HAVING THE TERMINAL CONNECTION STRUCTURE, AND METHOD FOR ASSEMBLING THE ELECTRICAL JUNCTION BOX

This invention relates to a terminal connection structure, an electrical junction box having the terminal connection structure, and a method for assembling the electrical junction box. In more detail, in the case where a terminal is soldered on a conductor on a printed board, alignment of the terminal is corrected to enable the terminal to be readily inserted into a terminal hole in the printed board. This application claims priority from Japanese Patent Application Number JP-2005-211446 filed Jul. 21, 2005, the entire contents of which are incorporated herein by reference.

BACKGROUND

Conventionally, an electrical junction box to be mounted on a motor vehicle includes a casing, a laminated body that layers bus bars and insulation plates alternately, and a printed board. The laminated body and printed board are contained in the casing. A terminal is soldered on a conductor on the printed board.

As an example of such an electrical junction box, the present applicant has provided an electrical junction box 1 shown in FIG. 6 and disclosed in Japanese Patent Public Disclosure 2003-249288 (JP-A-2003-249288). In the electrical junction box 1, in order to interconnect a terminal 2a of a bus bar 2 and a conductor on a printed board 3, as shown in FIG. 7, a partition insulation plate 5 is placed between the printed board 3 and a laminated body 4 in which the bus bars 2 and insulation plates are superposed alternately. The partition insulation plate 5 has a tab correction tube 5a that projects upward to correct alignment of the terminal 2a.

In a connection method using the partition insulation plate 5, firstly, the printed board 3 is placed on a top surface of the tab correction tube 5a so that a tab correction hole 5b in the tab correction tube 5a is communicated with a terminal hole 3a in the printed board 3. Then, as the partition insulation plate 5 and printed board 3 are moved down toward the bus bars 2, the terminal 2a is inserted into the tab correction hole 5b in the tab correction tube 5a to correct alignment of the terminal 2a. The terminal 2a, the alignment of which is corrected, is inserted into the terminal hole 3a in the printed board 3 and the terminal 2a is soldered on the conductor on the printed board 3 at a position H.

The printed board 3, after it is moved down toward the bus bars 2, is supported at a given height by tubular base 6 that projects from the insulation plate in the laminated body 4. The printed board 3 is secured to the tubular base 6 by a screw N.

In the above connection method, since the alignment of the terminal 2a to be inserted into the terminal hole 3a in the printed board 3 is corrected by the tab correction tube 5a on the partition insulation plate 5a, it is possible to easily insert the terminal 2a into the terminal hole 3a and to readily complete interconnecting the terminal 2a and the conductor on the printed board 3.

SUMMARY

However, in the above connection method, even after soldering the terminal 2a of the bus bar 2 on the conductor on the printed board 3, the tab correction tube 5a continues to maintain the alignment of the terminal 2a. Thus, in the case where the terminal 2a is maintained in correct alignment after connection to the printed board 3, the terminal hole 3a in the printed board 3 may shift position relative to the position of the terminal 2a, which has been positioned by the insulation plate. This shift can apply a load to the soldered part H, causing cracks in the soldered part H, and thereby generating a possible contact failure. This relative position shift may be caused, for example, by changes in temperature, since the printed board and the resin insulation plate have different heat expansion characteristics.

In view of the above problems, an object of exemplary embodiments of the present invention is to correct alignment of a terminal during insertion of the terminal in a printed board so that the terminal can be easily inserted into the terminal hole in the printed board, and to reduce the risk of cracks in a soldered part by releasing correction of alignment of the terminal after insertion.

In order to address the above problems, exemplary embodiments of the present invention provide a terminal connection structure with a printed board having a terminal hole and a conductor and an insulation plate having a terminal through-hole. A terminal may be inserted, in an insertion direction, via the terminal through-hole in the insulation plate into the terminal hole which provides a given clearance between an inner surface of the terminal through-hole and a whole peripheral surface of the terminal. The terminal through-hole has, on opposing portions of the inner surface, protrusions for correction of alignment of the terminal. The terminal is provided with bulged portions that protrude from the terminal in a direction perpendicular to the direction of insertion and are sized and positioned to be capable of engagement with the protrusions for correction of alignment of the terminal. In the final assembled state of the terminal connection structure, the bulged portions of the terminal do not engage the protrusions for correction of alignment, so that a given clearance exists between the inner surface of the terminal through-hole and the whole peripheral surface of the tabl-like terminal, and one end of the terminal is soldered to the conductor.

According to the above connection structure, when the terminal is inserted into the terminal hole in the printed board, the bulged portions of the terminal are located at the same height as the protrusions for correction of alignment in the terminal through-hole in the vertical direction (or the direction of insertion) such that the bulged portions of the terminal are positioned and held by the protrusions for correction of alignment. Accordingly, it is possible to readily insert the terminal into the terminal hole in the printed board and to enhance efficiency in working.

After inserting the terminal into the terminal hole in the printed board, the bulged portions of the terminal are shifted relative to the protrusions in the terminal through-hole by movement of the insulation plate away from the printed board. The terminal is released from correction of alignment that is caused by the protrusions in the terminal through-hole and the bulged portions of terminal. Consequently, even if the terminal through-holes in the insulation plates are shifted perpendicularly from the direction of insertion of the terminal relative to the terminal hole in the printed board due to differential heat expansion between the printed board and insulation plate or other reasons, the terminal can also move with shifts of the printed board without interference from the protrusions on the terminal through-hole. Accordingly, the risk of a large load being applied to the soldered part that interconnects the terminal and the conductor on the printed board, and cracks occurring in the soldered part, may be reduced.

In more detail, the terminal through-hole in the insulation plate may be provided on a peripheral edge at a terminal insertion side with a tapered guide portion and on a peripheral edge at the opposite side with a projecting peripheral wall to form a terminal insertion frame. Protrusions for correction of alignment are provided on an inner surface of the terminal through-hole at a terminal insertion side of the terminal insertion frame. The bulged portions of the terminal are disposed in the terminal insertion frame to be shifted away, in a direction parallel to the direction of insertion, from the protrusions on the inner surface of the terminal through-hole, before the terminal is soldered on the printed plate.

The protrusions for correction of alignment may be formed into L-shaped configurations, each of which extends along a corner of the inner surface of the terminal through-hole.

According to the above construction, a pair of the L-shaped protrusions for correction of alignment can engage and position the terminal in every direction. Also, since the protrusions are provided only on the diagonal corners in the terminal through-hole, and not on the whole periphery of the inner surface of the terminal through-hole, it should be possible to smoothly insert the terminal into the space between the protrusions in the terminal through-hole.

In the condition where alignment of the terminal is corrected by the protrusions for correction of alignment in the terminal through-hole in the insulation plate and by the bulged portions of the terminal, at least a part of the outer surfaces of the bulged portions of the terminal may contact with at least a part of the inner surfaces of the protrusions for correction of alignment.

According to the above construction, it is possible to reliably correct the alignment of the terminal and to readily insert the terminal into the terminal hole in the printed board by contacting at least a part of the bulged portions of the terminal with at least a part of the protrusions in the terminal through-hole. In this case, since the terminal is released from correction of alignment after inserting the terminal into the terminal hole in the printed board, subsequent problems of crack formation in the soldered part may be reduced.

Exemplary embodiments of the present invention are directed to an electrical junction box having the terminal connection structure described above. The insulation plate may be part of a laminated body that superposes bus bars and insulation plates alternately, and the laminated body and the printed board may be contained in a casing assembly of the electrical junction box. The terminal projects from the bus bar. The terminal is soldered on a conductor on the printed board. The protrusions for correction of alignment are provided on the terminal through-hole in the outermost insulation plate at a printed board arrangement side.

Furthermore, exemplary embodiments of the present invention are directed to a method for assembling an electrical junction box. The method may include the following steps. A first step space the printed board and the insulation plate from another insulation plate, using a positioning jig, such that the bulged portions of the terminal engage the protrusions for correction of alignment. Next, the positioning jig is withdrawn until the insulation plate is supported by the other insulation plate, and the bulged portions of the terminal no longer engage the protrusions for correction of alignment. Finally, the terminal is soldered to the conductor.

According to the method for assembling the above electrical junction box, when the terminal of the bus bar is inserted into the terminal hole in the printed board, the positioning jig supports the outermost insulation plate at a given position in height spaced away from other insulation plates and the bulged portions of the terminal are aligned with the protrusions in the terminal through-hole. Accordingly, the alignment of the terminal of the bus bar is corrected by the protrusions for correction of alignment and bulged portions of the terminal, and the terminal of the bus bar can be readily inserted into the terminal hole in the printed board, thereby enhancing efficiency of the assembly operation.

After inserting the terminal into the terminal hole in the printed board, the positioning jig is extracted from the jig through-hole, and the outermost insulation plate is moved toward the other insulation plates, and may be placed on the other insulation plates. The movement of the outermost insulation plate causes the bulged portions of the terminal to shift relative to the protrusions in the terminal through-hole with respect to the direction of movement of the outermost insulation plate. Consequently, the terminal is released from correction of alignment by the protrusions and bulged portions. Accordingly, even if the terminal through-hole in the outermost insulation plate subsequently shifts relative to the terminal hole in the printed board due to, for example, heat expansion, the end of the terminal soldered to the printed board should be able to move with the movement of the printed board without interference from the protrusions for correction of alignment in the terminal through-hole in the outermost insulation plate. This can reduce the risk of a large load being applied to the soldered part which interconnects the terminal and the conductor on the printed board, thereby reducing the possibility of cracks in the soldered part.

As described above, according to the exemplary embodiments of the present invention, when the terminal is inserted into the terminal hole in the printed board, the bulged portions of the terminal are aligned with the protrusions for correction of alignment in the terminal through-hole and the alignment of the terminal is corrected by the protrusions for correction of alignment and the bulged portions of the terminal. Accordingly, it is possible to readily insert the terminal into the terminal hole in the printed board, thereby enhancing efficiency of an assembly operation.

After inserting the terminal into the terminal hole in the printed board, the position of the bulged portions of the terminal is shifted relative to the protrusions in the terminal through-hole insertion direction by movement of the outermost insulation plate, so that the terminal is released from correction of alignment by the protrusions in the terminal through-hole and the bulged portions of the terminal. Consequently, even if the terminal through-hole in the insulation plate is shifted particularly to the insertion direction relative to the terminal hole in the printed board due to heat expansion or some other cause, the end-of-tab terminal soldered to the printed board should be able to move with the movement of the printed board without interference with the protrusions in the terminal through-hole in the insulation plate. Accordingly, the risk of a large load being applied to the soldered part that interconnects the terminal and the conductor on the printed board, and the possibility of cracks in the soldered part, may be reduced.

According to the above-described method for assembling the electrical junction box, when the terminal of the bus bar is inserted into the terminal hole in the printed board, the positioning jig supports the outermost insulation plate at a given position spaced away from the other insulation plates and the bulged portions of the terminal are aligned with and engage the protrusions in the terminal through-hole with respect to the insertion direction. Accordingly, the alignment of the terminal of the bus bar is corrected by the bulged portions of the terminal and the protrusions for correction of alignment in the terminal through-hole, and the terminal of the bus bar can be readily inserted into the terminal hole in the printed board, thereby enhancing efficiency of the assembly operation.

After inserting the terminal into the terminal hole in the printed board, the positioning jig is extracted from the jig through-hole, and the outermost insulation plate is moved toward the other insulation plates. This causes the bulged portions of the terminal to shift relative to the protrusions in the terminal through-hole with respect to the insertion direction. Consequently, the terminal can be released from correction of alignment by the combination of the protrusions and bulged portions.

These and other objects, advantages and features are described in or apparent from the following detailed description.

BRIEF DESCRIPTION OF THE DRAWINGS

Exemplary embodiments of the present invention will be described below, with reference to the drawings, in which like numbers represent like parts, and in which.

DETAILED DESCRIPTION OF EMBODIMENTS

Figure 1:
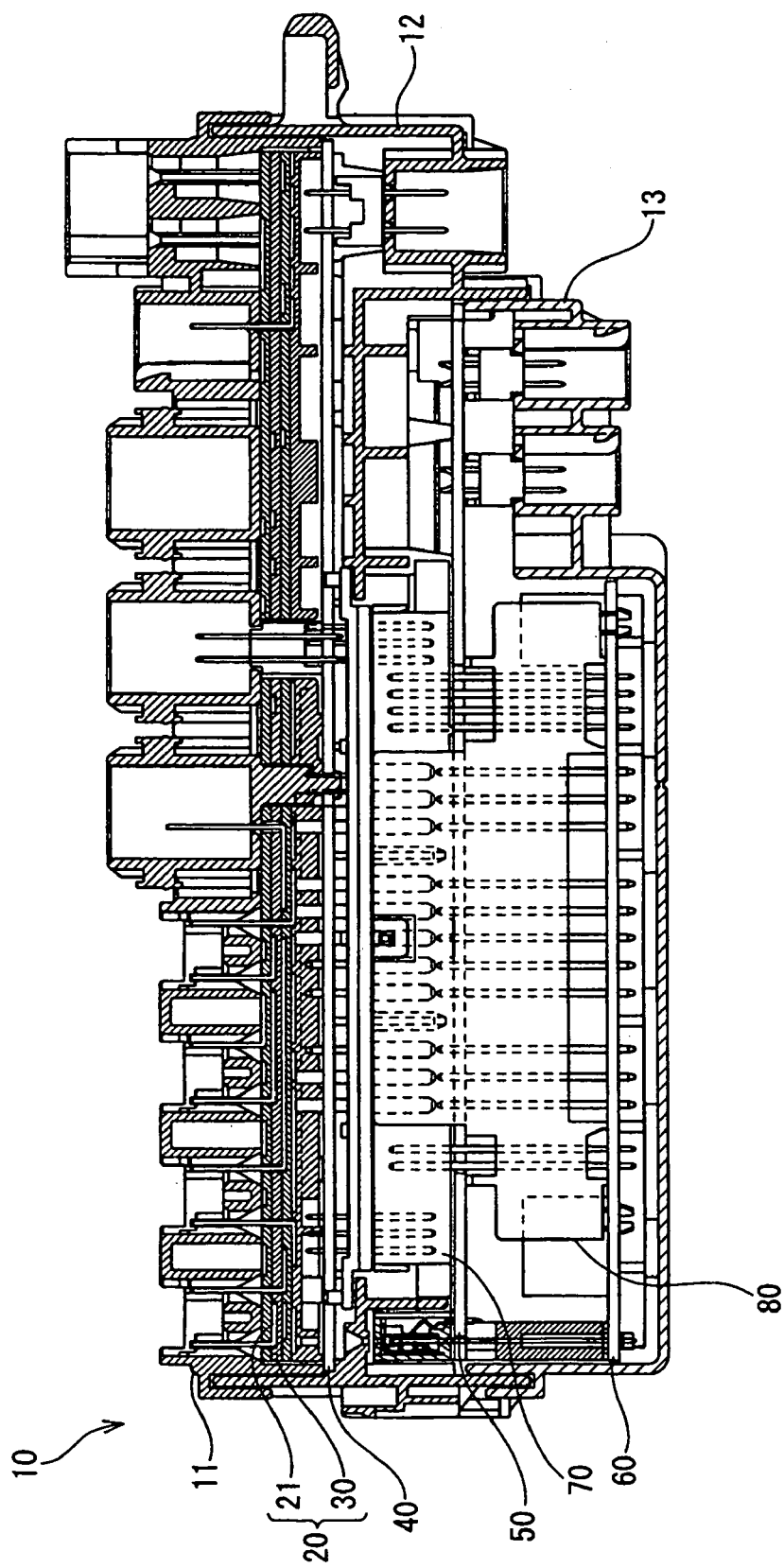
FIG. 1 is a sectional view of an electrical junction box of an embodiment in accordance with the present invention.

FIGS. 1 through 4 show an embodiment of the present invention. An electrical junction box 10 includes a casing assembly including an upper casing 11, an intermediate casing 12, and a lower casing 13. A laminated body 20, a first printed board 40, a second printed board 50, and a third printed board 60 are spaced away from one another vertically and secured in the casing assembly. The laminated body 20 is formed by alternately layering bus bars 21 made of a conductive metal plate and insulation plates 30 made of a resin material. The bus bars 21 and conductors on the three printed boards 40, 50, 60 are connected to given terminals through a relay connector 70 mounted on the second printed board 50 or a relay connector 80 on the third printed board 60.

Figure 2:
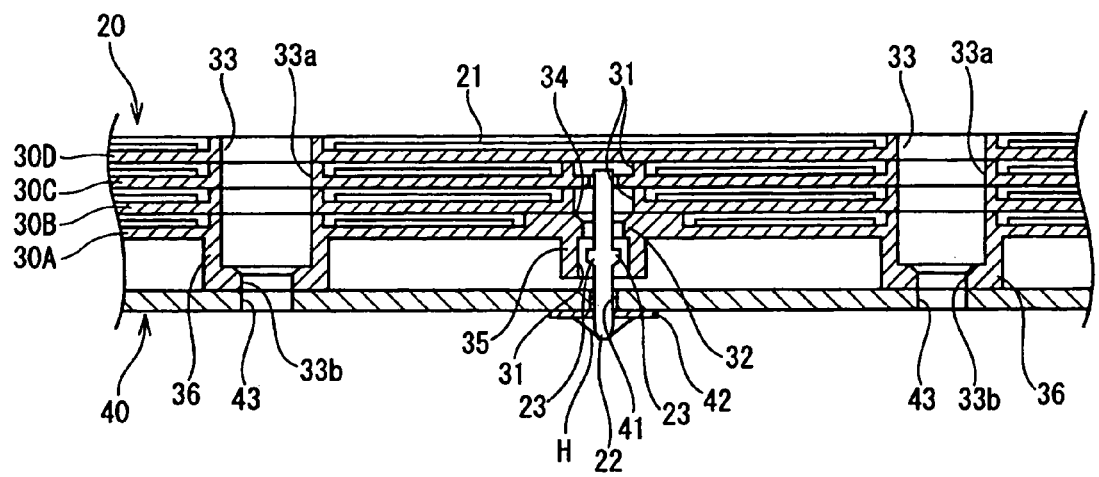
FIG. 2 is an enlarged sectional view of main parts of a laminated body and a first printed board.

As shown in FIG. 2, the laminated body 20 and first printed board 40 are disposed in the casing assembly so that the laminated body 20 is placed on a top surface of the first printed board 40. In the present embodiment, the laminated body 20 includes four insulation plates 30, although this invention may be applied to any number of insulation plates. The outermost insulation plate 30A (lowermost layer in FIG. 2) is disposed above the first printed board 40 while the other insulation plates 30B, 30C, and 30D are disposed above the outermost insulation plate 30A.

A given insulation plate out of the insulation plates 30A to 30D is provided with a terminal through-hole 31 into which a terminal 22 on the bus bar 21 is inserted. The terminal 22 may have a rectangular cross section.

Figure 3:
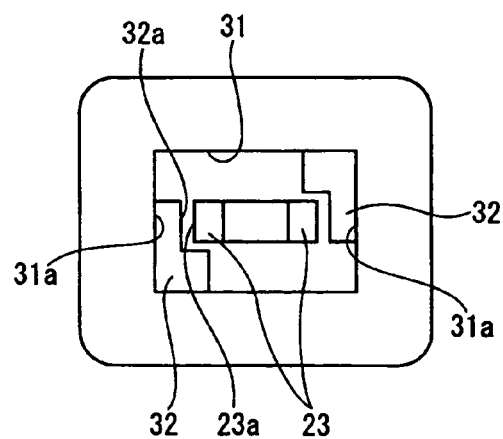
FIG. 3 is a plan view of a terminal inserted into a terminal through-hole in an insulation plate.

The terminal through-hole 31 in the outermost insulation plate 30A has a rectangular cross section, and the walls of the terminal through-hole are spaced away from the entire periphery of the terminal 22 by a given clearance. The terminal through-hole 31 is provided on a peripheral edge at a terminal insertion side (an upper side in FIG. 2, although any orientation is possible) with a tapered guide portion 34 and on a peripheral edge at an opposite side (a lower side in FIG. 2, although any orientation is possible) with a projecting peripheral wall to form a terminal insertion frame 35. A pair of protrusions 32 for correction of alignment (hereinafter referred to "protrusions" 32) is provided on diagonal corners on an inner surface 31a of the terminal through-hole 31. As shown in FIG. 3, each protrusion 32 may have an L-shaped configuration when viewed through the terminal through-hole and extends along the corner of the inner surface 31a of the terminal through-hole 31. Also, the protrusions 32 are provided at a terminal insertion side (at a side of the guide portion 34) of the terminal insertion frame 35 to extend an inner surface 32a of each protrusion 32 to each guide portion 34.

The terminal 22 on the bus bar 21 is provided on the opposite sides of an intermediate position with bulged portions 23. The bulged portions 23 are located at a position lower than the protrusions 32 in the terminal through-hole 31. The bulged portions 23 are provided with tapered surfaces (lower surfaces in the present embodiment) at a tab distal end side. Also, a distal end of the terminal 22 projects from a lower end of the terminal through-hole 31, passes a terminal hole 41 in the first printed board 40, and is soldered on a conductor 42 at a position H.

As shown in FIG. 3, the inner surfaces 32a of the protrusions 32 are disposed near the outer surfaces 23a of the bulged portions 23 of the terminal 22 at a position closer than the inner surface 31a of the terminal through-hole 31.

As mentioned above, the bulged portions 23 of the terminal 22 are shifted from the protrusions 32 in the terminal through-hole 31 in the direction of terminal insertion. However, when the terminal 22 is inserted into a terminal hole 41 in the first printed board 40, the bulged portions 23 are aligned with the protrusions 32 in the direction of terminal insertion, and the protrusions 32 clamp and hold the bulged portions 23 in position.

The insulation plates 30A to 30D are provided together with jig through-holes 33 through which a positioning jig 90 (described below) passes. The jig through-holes 33 have a same large diameter portion 33a extending from the upper insulation plate 30D to a point part-way through the outermost insulation plate 30A, and have a small diameter portion 33b at the lower end of the outermost insulation plate 30A. A peripheral wall projects around the jig through-hole 33 in the outermost insulation plate 30A at the side of the first printed board 40 to form a jig insertion frame 36. A distal end of the jig insertion frame 36 contacts a top surface of the first printed board 40. Jig through-holes 43 are provided in the first printed plate 40. The jig through-holes 43 is communicate with the jig through-holes 33 in the insulation plates 30A to 30D and have substantially the same diameter as that of the small diameter portions 33b in the jig through-holes 33. In the present embodiment, the terminal through-holes 31 are between the jig through-holes 33 while terminal hole 41 in the first printed board 40 is between the jig through-holes 43.

One or more positioning jigs 90 are utilized when the terminal 22 of the bus bar 21 in the laminated body 20 is inserted into the terminal hole 41 in the first printed board 40. As shown in FIG. 4, the positioning jigs 90 have a proximal end with a wide portion 90a, which has substantially the same width as the great diameter portion 33a of the jig through-holes 33, and a distal end with a narrow portion 90b, which has substantially the same width as the small diameter portion 33b of the jig through-holes 33. A support portion 90c is provided between the wide portion 90a and the narrow portion 90b.

Next, a method for interconnecting the terminal 22 on the bus bar 21 in the laminated body 20 and the conductor 42 on the first printed board 40 will be described below. For ease of description, the method will be described based on the spatial orientation illustrated in FIGS. 4A, 4B and 4C, although the invention may be applied to other spatial orientations.

Figure 4A:
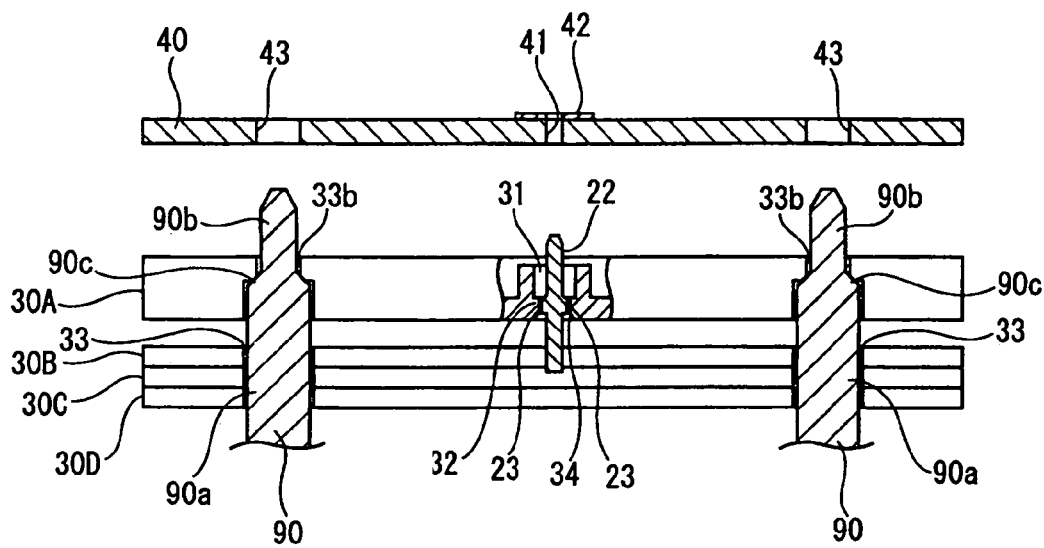
FIGS. 4A to 4C are explanatory views of a method for interconnecting a terminal provided on a bus bar in a laminated body and a conductor on a first printed board.

In a first step, as shown in FIG. 4A, the laminated insulation plates 30B to 30D are arranged top side down, the positioning jigs 90 are inserted upward into the jig through-holes 33 in the insulation plates 30B to 30D and the positioning jig 90 is stopped when the positioning jigs 90 project from the jig through-holes 33 by a predetermined length.

In a second step, the positioning jigs 90 are inserted upward into the jig through-holes 33 in the outermost insulation plate 30A, the support portions 90c of the positioning jigs 90 are brought into contact with a lower peripheral edge around the small diameter portion 33b in the jig through-holes 33, and the positioning jigs 90 support the outermost insulation plate 30A so that the plate 30A is spaced away from the insulation plate 30B by a predetermined distance. At this time, the protrusions 32 in the terminal through-hole 31 are opposed horizontally to the bulged portions 23 of the terminal 22 of the bus bar 21 and the terminal 22 is inserted upward into the terminal through-hole 31 in the outermost insulation plate 30A. Alignment of the terminal 22 can be corrected by the protrusions 32 and bulged portions 23.

Figure 4B:
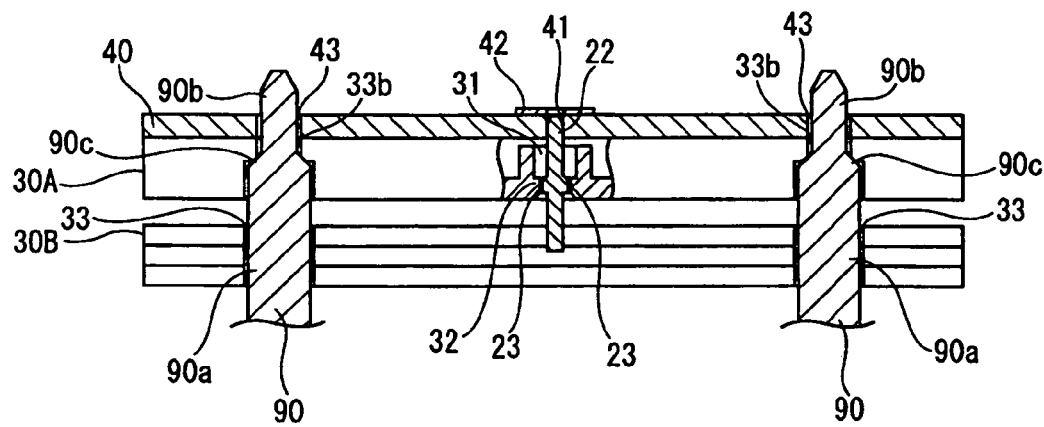

In a third step, as shown in FIG. 4B, the positioning jigs 90, which project from the jig through-hole 33 in the outermost insulation plate 30A, are inserted upward into the jig through-holes 43 in the first printed board 40, which is in a top side down, thereby positioning the first printed board 40 with respect to the outermost insulation plate 30A in a horizontal direction. Under this condition, the first printed board 40 is further pushed down so that the terminal 22 of the bus bar 2 is inserted upward into the terminal hole 41 in the first printed board 40, thereby bringing the first printed board 40 into contact with the outermost insulation plate 30A.

Figure 4C:
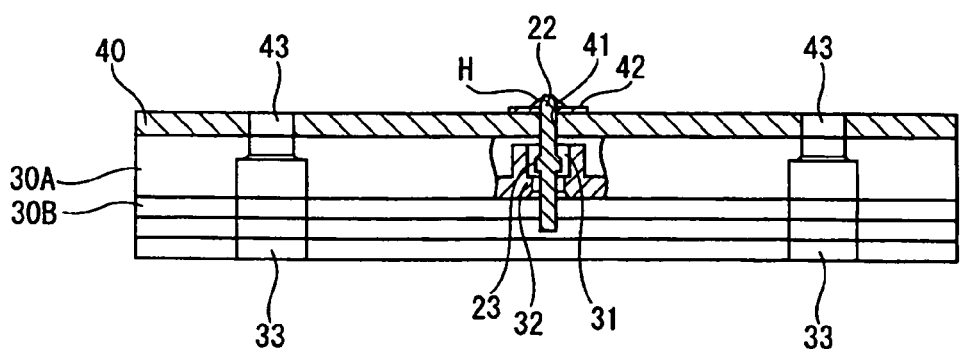

In a fourth step, as shown in FIG. 4C, the positioning jigs 90 are extracted from the jig through-holes 43 and 33, and the outermost insulation plate 30A is moved toward and placed on the insulation plate 30B. Then, the bulged portions 23 of the terminal 22 are shifted from the protrusions 32 in the terminal through-hole 31 in the outermost insulation plate 30A in a vertical direction (which is parallel to the direction of insertion).

In the final step, the terminal 22 of the bus bar 21 is soldered on the conductor 42 of the first printed board 40.

According to the above construction, when the terminal 22 of the bus bar 21 is inserted into the terminal hole 41 in the first printed board 40, the positioning jig 90 supports the outermost insulation plate 30A at a given position spaced from the insulation plate 30B and the bulged portions 23 of the terminal 22 are aligned with the protrusions 32 in the terminal through-hole 31 in a vertical direction. Accordingly, the alignment of the terminal 22 of the bus bar 21 is corrected by the interaction of protrusions 32 and bulged portions 23, and the terminal 22 of the bus bar 21 can be readily inserted into the terminal hole 41 in the first printed board 40, thereby enhancing efficiency of the assembly operation.

After inserting the terminal 22 into the terminal hole 41 in the first printed board 40, the positioning jigs 90 are extracted from the jig through-holes 43 and 33, and the outermost insulation plate 30A is moved toward and placed on the insulation plate 30B. Then, the bulged portions 23 of the terminal 22 are shifted from the protrusions 32 in the terminal through-hole 31 in a vertical direction. Consequently, the terminal 22 is released from correction of alignment by the protrusions 32 and bulged portions 23. Accordingly, even if the terminal through-holes 33 in the insulation plates 30 are shifted from the terminal hole 41 in the first printed board 40 in a horizontal direction on account of heat expansion or otherwise, it is possible for the end of the terminal 22 soldered to the printed board to follow the movement of the first printed board 40 without any interference with the protrusions 32. This can prevent or reduce loads from being applied to the soldered part, which interconnects the terminal 22 and conductor 42 on the first printed board 40, thereby reducing the possibility of cracks in the soldered part.

Figure 5:
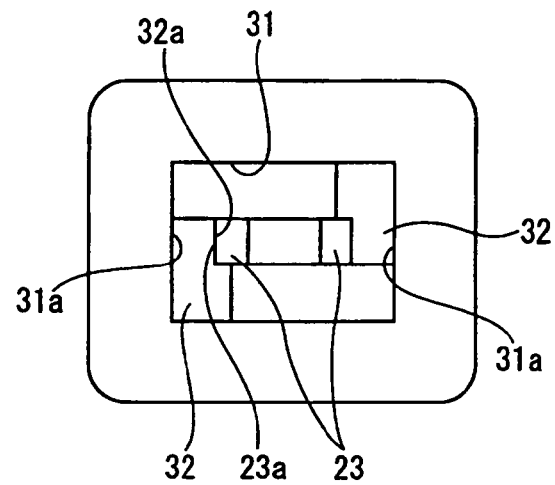
FIG. 5 shows another embodiment of the present invention.
Figure 6:
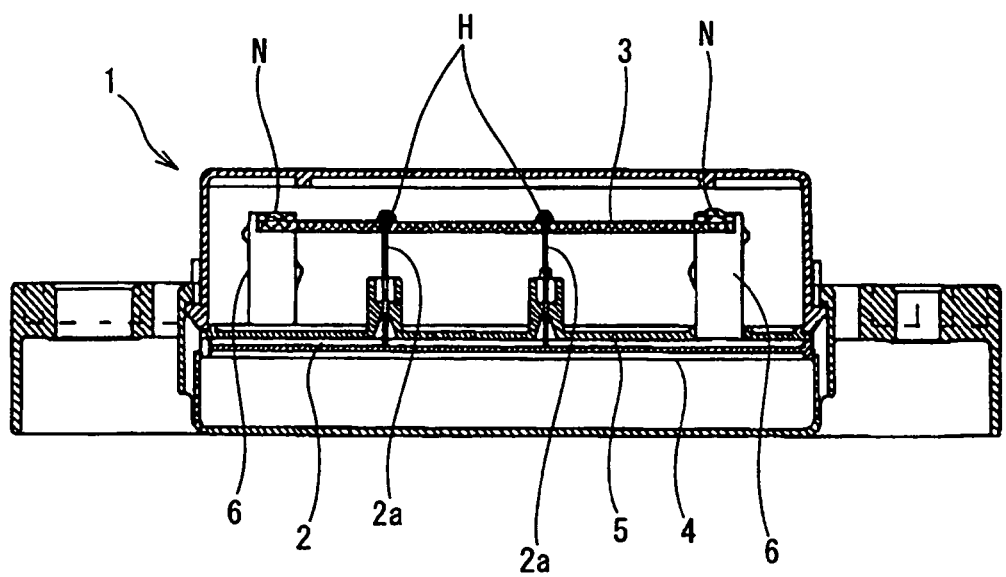
FIG. 6 is a sectional view of a conventional electrical junction box.
Figure 7:
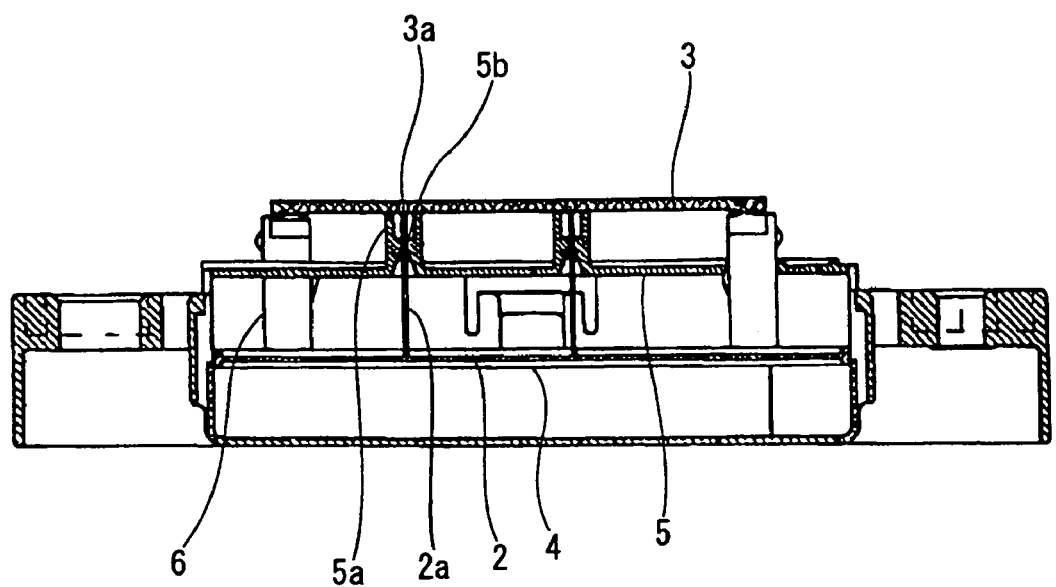
FIG. 7 shows a method for assembling the conventional electrical junction box.

FIG. 5 shows another embodiment of the present invention.

In this embodiment, the protrusions 32 for correction of alignment are provided on the inner surface 31 of the terminal through-hole 31 in the outermost insulation plate 30A and the inner surfaces 32a of the protrusions 32 are arranged to contact the outer surfaces 23a of the bulged portions 23 when viewed from above.

According to the above structure, in the condition in which alignment of the terminal 22 is corrected by the protrusions 32 and bulged portions 23, the outer surfaces 23a of the bulged portions 23 of the terminal 22 contact with at least a part of the inner surfaces 32a of the protrusions 32. Accordingly, it is possible to reliably correct the alignment of the terminal 22 and to readily insert the terminal 22 into the terminal hole 41 in the first printed board 41. In this case, since the terminal 22 is released from correction of alignment after inserting the terminal 22 into the terminal hole 41 in the first printed board 40, the possibility of causing any cracks in the soldered part may be reduced.

Since the other structures and operational effects are the same as those of the first embodiment, explanation of them is omitted by giving the same signs to the same elements.

Although the invention has been described with reference to specific embodiments, these embodiments should be viewed as illustrations and not limiting. Various modifications, substitutes and improvements are possible within the spirit or scope of the invention.

What is claimed is:

1. A terminal connection structure, comprising:
a printed board having a terminal hole and conductor;
an insulation plate having a terminal through-hole; and
a terminal that is inserted, in an insertion direction, via the terminal through-hole in the insulation plate into the terminal hole, a given clearance being provided between an inner surface of the terminal through-hole and a whole peripheral surface of the terminal, and the terminal through-hole including, on opposing portions of the inner surface, protrusions for correction of alignment of the terminal;

the terminal being provided with bulged portion that protrude from the terminal in a direction perpendicular to the direction of insertion and are sized and positioned to be capable of engagement with the protrusions for correction of alignment;

wherein, in a final, assembled state of the terminal connection structure, the bulged portions do not engage the protrusions for correction of alignment, the given clearance exists between the inner surface of the terminal through-hole and the whole peripheral surface of the terminal, and an end of the terminal is soldered to the conductor.

2. A terminal connection structure according to claim 1, wherein:

the terminal through-hole in the insulation plate includes a tapered guide portion provided on a peripheral edge at a terminal insertion side, and a projecting peripheral wall forming a terminal insertion frame on a peripheral edge at the opposite side; the protrusions for correction of alignment are provided on an inner surface of the terminal through-hole at a terminal insertion side of the terminal insertion frame; the bulged portions of the terminal are disposed in the terminal insertion frame, shifted from the protrusions on the inner surface of the terminal through-hole, when the terminal is soldered on the printed plate.

3. A terminal connection structure according to claim 1, wherein the terminal through-hole is rectangular, and the protrusions for correction of alignment are formed into L-shaped configurations each of which extends along a corner of the inner surface of the terminal through-hole.

4. An electrical junction box having a terminal connection structure according to claim 1, comprising:

a bus bar, the insulation plate and the printed board, contained in a casing assembly of the electrical junction box;

wherein the terminal projects from the bus bar.

5. A method for assembling an electrical junction box according to claim 4, comprising:

spacing the printed board and the insulation plate from another insulation plate, using a positioning jig, such that the bulged portions of the terminal engage the protrusions for correction of alignment;

withdrawing the positioning jig until the insulation plate is supported by the other insulation plate, and the bulged portions of the terminal do not engage the protrusions for correction of alignment; and soldering the terminal to the conductor.

6. A terminal connection structure according to claim 2, wherein the terminal through-hole is rectangular, and the protrusions for correction of alignment are formed into L-shaped configurations each of which extends along a corner of the inner surface of said of the terminal through-hole.

7. An electrical junction box having a terminal connection structure according to claim 2, comprising:

a bus bar, the insulation plate and the printed board, contained in a casing assembly of the electrical junction box;

wherein the terminal projects from the bus bar.

8. An electrical junction box having a terminal connection structure according to claim 3, comprising:

a bus bar, the insulation plate and the printed board, contained in a casing assembly of the electrical junction box;

wherein the terminal projects from the bus bar.

9. An electrical junction box having a terminal connection structure according to claim 6, comprising:

a bus bar, the insulation plate and the printed board, contained in a casing assembly of the electrical junction box;

wherein the terminal projects from the bus bar.

10. A method for assembling an electrical junction box according to claim 7, comprising:

spacing the printed board and the insulation plate from another insulation plate, using a positioning jig, such that the bulged portions of the terminal engage the protrusions for correction of alignment;

withdrawing the positioning jig until the insulation plate is supported by the other insulation plate, and the bulged portions of the terminal do not engage the protrusions for correction of alignment; and soldering the terminal to the conductor.

11. A method for assembling an electrical junction box according to claim 8, comprising:

spacing the printed board and the insulation plate from another insulation plate, using a positioning jig, such that the bulged portions of the terminal engage the protrusions for correction of alignment;

withdrawing the positioning jig until the insulation plate is supported by the other insulation plate, and the bulged portions of the terminal do not engage the protrusions for correction of alignment; and soldering the terminal to the conductor.

12. A method for assembling an electrical junction box according to claim 9, comprising:

spacing the printed board and the insulation plate from another insulation plate, using a positioning jig, such that the bulged portions of the terminal engage the protrusions for correction of alignment;

withdrawing the positioning jig until the insulation plate is supported by the other insulation plate, and the bulged portions of the terminal do not engage the protrusions for correction of alignment; and soldering the terminal to the conductor.

* * * * *